US007698810B2

(12) United States Patent
Huss, Jr.

(10) Patent No.: US 7,698,810 B2
(45) Date of Patent: Apr. 20, 2010

(54) CONNECTOR REMOVAL SYSTEM

(75) Inventor: John P. Huss, Jr., Harrisburg, PA (US)

(73) Assignee: Hon Hahi Precision Ind. Co., Ltd., Taipei Hsien (TW)

( * ) Notice: Subject to any disclaimer, the term of this patent is extended or adjusted under 35 U.S.C. 154(b) by 761 days.

(21) Appl. No.: 11/137,596

(22) Filed: May 24, 2005

(65) Prior Publication Data

US 2006/0270256 A1 Nov. 30, 2006

(51) Int. Cl.
*H05K 13/04* (2006.01)

(52) U.S. Cl. ............................ 29/764; 29/758; 439/595

(58) Field of Classification Search ................... 29/764, 29/762, 750, 758, 270, 426.1, 426.5, 426.6, 29/854; 439/595, 133, 752; 294/99.2, 106
See application file for complete search history.

(56) References Cited

U.S. PATENT DOCUMENTS

| | | | | | |
|---|---|---|---|---|---|
| 3,110,093 | A | * | 11/1963 | Johnson | 29/747 |
| 3,380,141 | A | * | 4/1968 | Rofer | 29/764 |
| 3,451,117 | A | * | 6/1969 | Cameron | 29/764 |
| 3,461,533 | A | * | 8/1969 | Anhalt | 29/764 |
| 3,588,983 | A | * | 6/1971 | Hoy | 29/764 |
| 3,676,912 | A | * | 7/1972 | Anhalt et al. | 29/747 |
| 3,896,535 | A | * | 7/1975 | Tucci | 29/747 |
| 4,414,736 | A | * | 11/1983 | Fieberg et al. | 29/747 |
| 4,494,305 | A | * | 1/1985 | Safai | 29/764 |
| 4,864,719 | A | * | 9/1989 | Rudy et al. | 29/764 |
| 5,040,289 | A | * | 8/1991 | Flaynik | 29/764 |
| 5,327,641 | A | * | 7/1994 | Olsson | 29/747 |
| 5,735,039 | A | * | 4/1998 | Shuey et al. | 29/829 |
| 6,247,966 | B1 | | 6/2001 | Klein et al. | |
| 6,634,096 | B1 | * | 10/2003 | Yamamoto et al. | 29/764 |
| 2006/0270256 | A1 | * | 11/2006 | Huss | 439/157 |
| 2007/0011857 | A1 | * | 1/2007 | Francis et al. | 29/426.5 |

* cited by examiner

*Primary Examiner*—Minh Trinh
(74) *Attorney, Agent, or Firm*—Ming Chieh Chang; Wei Te Chung; Andrew C. Cheng

(57) ABSTRACT

A connector removal system includes a connector housing (1) forming contacts (10) therein and a contact extraction tool (3) for removing the contact of the connector housing. The connector housing has a mating face (200), a plurality of cavities (22) receiving corresponding contacts and a plurality of cantilevered flexible latches (26) retaining corresponding contacts. The latch forms an external side face of the housing. Each cavity has an open cavity entrance (220) located at a distal end thereof on the mating face and an opening (222) formed adjacent the entrance between the cavity and the external side face. The contact extraction tool includes a pair of registration posts (34) formed from an end edge thereof for positioning inside the entrances and an ejecting member (36) for deflecting said cantilevered flexible latch to disengage from said contact.

1 Claim, 7 Drawing Sheets

CONNECTOR REMOVAL SYSTEM

BACKGROUND OF THE INVENTION

1. Field of the Invention

The present invention generally relates to a wire harness connector provided in an automotive vehicle or the like, and more particularly, to a contact extraction tool for removing a contact retained in a housing of the connector therefrom.

2. Description of Related Art

In some electrical connector designs, the contact terminals are inserted into terminal receiving bores in the insulation body or block after the connector member has been otherwise completely fabricated or assembled, and locking means is provided between the individual contact terminals and their respective bore walls for retaining the terminals in their operative positions in the insulation body.

For example, U.S. Pat. No. 6,247,966 B1 (the '966 patent) assigned to Tyco Electronics Corp. discloses such an electrical connector with exposed molded latches. With reference to the description of the '966 patent along with the FIGS. 2-3 of the '966 patent, contact terminals 10 located in receiving cavities 30 in a molded housing 20 are held in place by primary latching members that comprise molded deflectable cantilever latches 50. During insertion and removal of the contact terminals 10, the latches 50 are deflected resiliently and outwardly. If for any reason, such as for repair or replacement of the contact terminal, the contact terminal is to be removed from its corresponding receiving cavity. Therefore, it is necessary to employ a tool which can be inserted into a suitable clearance between the contact terminal 10 and the housing 20 to disengage the deflectable cantilever latch 50 and thereby permit manual withdrawal of the contact terminal 10 from the housing 20 by pulling on the wire attached to the contact terminal 20.

SUMMARY OF THE INVENTION

An object of the present invention is to provide a contact extraction tool that is adapted to easily remove a conductive contact from a connector housing and prevent excessive deflection of a flexible latch of the connector housing so that the flexible latch is not damaged during the removal of the contact.

In order to achieve the object set forth, a contact extraction tool in accordance with the preferred embodiment of the present invention comprises an aligning member for aligning and positioning the contact extraction tool to a connector housing. The connector housing comprises cavities defined therein and cantilevered flexible latches retaining the contacts in corresponding cavities. Each latch forms an inwardly projecting lug for receipt in a corresponding latching window located along one side of the contact. The contact extraction tool further comprise an ejecting member having a driving slope for allowing deflecting the latch to release the lug from the latching window and disengage the contact and the latch.

Other objects, advantages and novel features of the invention will become more apparent from the following detailed description when taken in conjunction with the accompanying drawings.

DETAILED DESCRIPTION OF THE PREFERRED EMBODIMENTS

Reference will now be made in detail to the preferred embodiment of the present invention.

Figure 1:
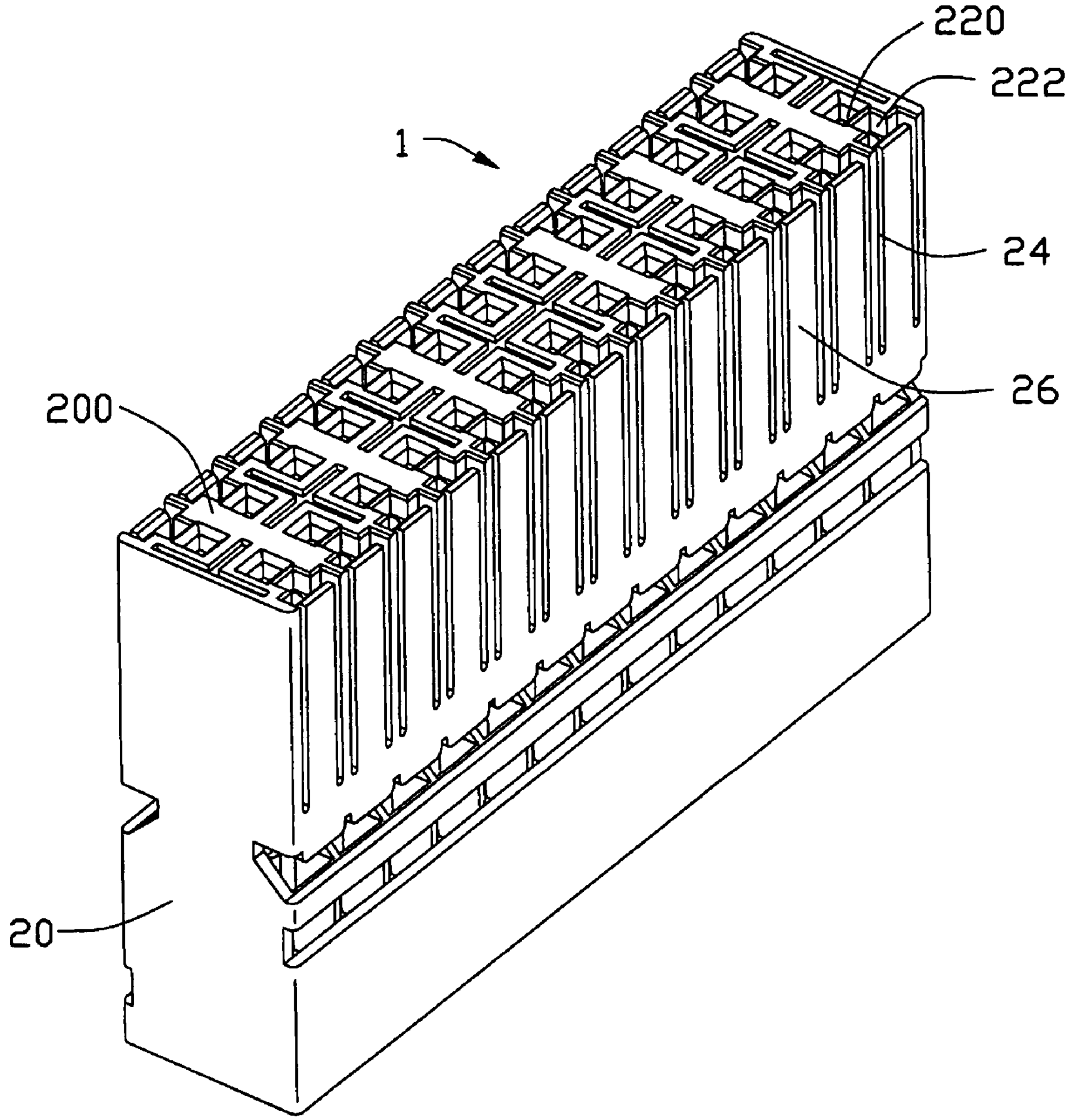
FIG. 1 is a perspective view of a wire harness connector according to an embodiment of the present invention.
Figure 3:
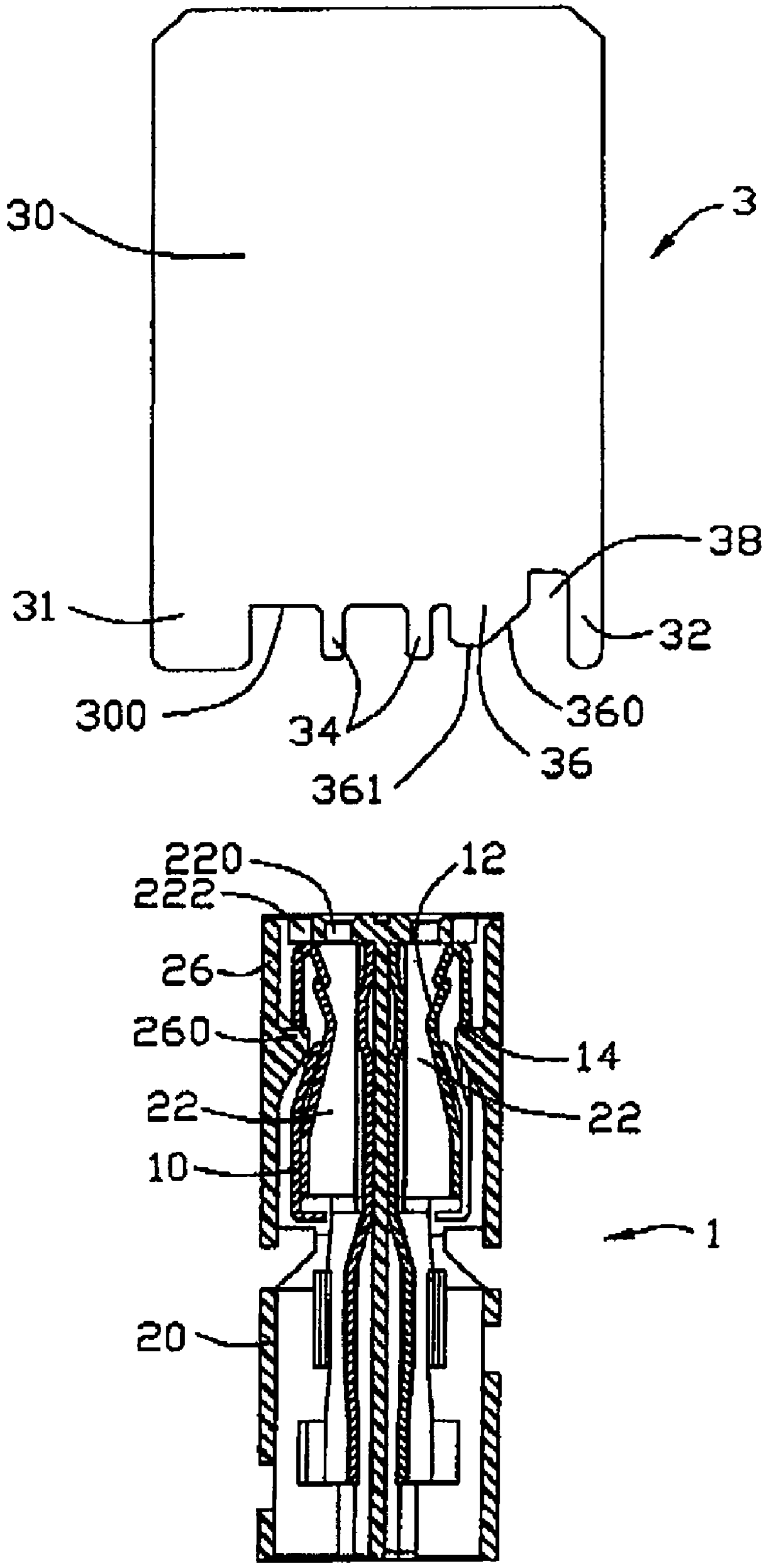
FIG. 3 is a cross-sectional view showing before the contact extraction tool is inserted into the wire harness connector.

Referring now to FIGS. 1 and 3, a contact extraction tool 3 according to the preferred embodiment of the present invention is used for removing a contact 10 from a wire harness connector 1.

The wire harness connector 1 comprises a connector housing 20 retaining a plurality of conductive contacts 10 therein. Each contact 10 has a mating socket 12 located one end with a latching window 14 located along one side of the contact 10. The housing 20 has a mating face 200 for mating with a complementary header (not shown). The housing 20 defines two rows of cavities 22 into which the contacts 10 are inserted through a rear face toward the mating face 200 of the housing 20. Each of the cavities 22 has an open cavity entrance 220 located at a distal end of the cavity 22 on the mating face 200. For the wire harness connector 1 depicted herein, two rows of cavities 22 are formed with two rows of cavity entrances 220. Each cavity entrance 220 is dimensioned and positioned for receipt of a header pin (not shown) when the wire harness connector 1 is mated to the complementary header. Openings 222 are formed adjacent each cavity entrance 220 between the cavity 22 and an external side face of the connector housing 20. The housing 20 has a generally rectangular cross section with laterally extending opposite housing sides forming external side faces which are interrupted by slots 24 defining cantilevered flexible latches 26 that form a portion of the external side faces. Each of the flexible latches 26 serving as a retention means can secure a corresponding contact 10 in a corresponding cavity 22. An inwardly projecting latching lug 260 has a shape suitable for receipt in the latching window 14 and is located on each latch 26 between a fixed rear end and a forward end of the latch 26.

Figure 2:
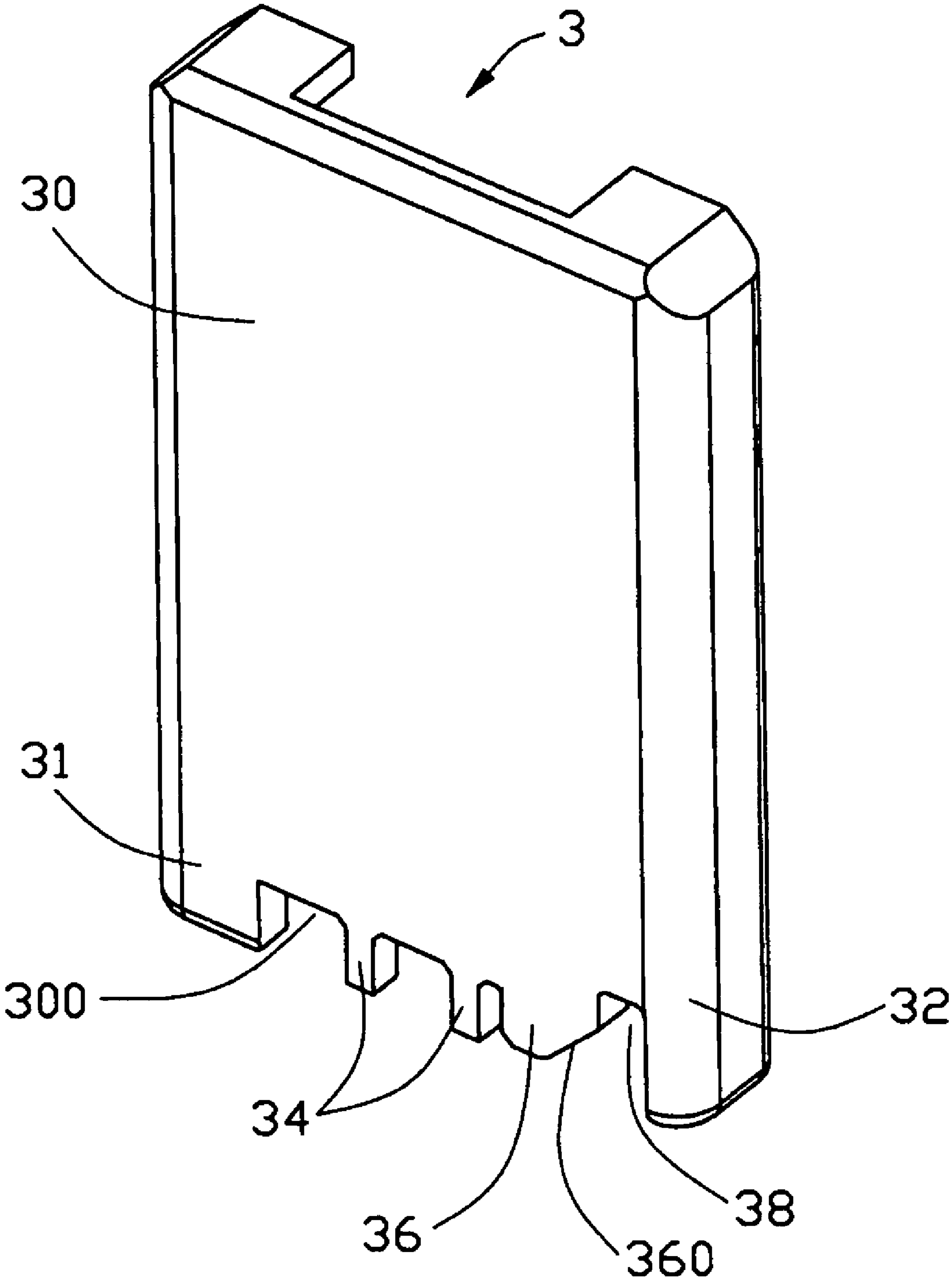
FIG. 2 is a perspective view of a contact extraction tool according to an embodiment of the present invention.

Referring to FIG. 2, the contact extraction tool 3 includes a main portion 30, and first and second side supports 31, 32 located at opposite sides and extending downwardly from a low end edge 300 of the main portion 30. The contact extraction tool 3 between the first and the second side supports 31, 32 further includes an aligning member, an ejecting member located adjacent to the aligning member, and an anti-overstress means adjacent to the ejecting member. The main portion 30 functions as a holding portion for facilitating to be seized by hand. The aligning member is a pair of registration posts 34 in the preferred embodiment of the present invention extending downwardly from the lower end edge 300 of the main portion 30 for aligning the contact extraction tool 3 to the housing 20. These two aligning posts 34 along with the first side support 31 of the contact extraction tool 3 register and stabilize the contact extraction tool 3 to the housing 20. The ejecting member, also being regarded as an actuating device, is a lifting tab 36 in the preferred embodiment of the present invention for allowing said latch 26 to deflect outwardly so as to cause the lug 260 to be outside of the window 14 and further release said latch 26 from said contact 20. A cutout 38 is formed between the lifting tab 36 and the second side support 32. The cutout 38 and the second side support 32 serve as an anti-overstress means for preventing the latch 26 from deflecting excessively. The lifting tab 36 has a driving slope 360 in one side proximate to the anti-overstress means for deflecting the latch 26 outwardly. The lifting tab 36 further has a confrontation head 361 at the front end for pushing the contact 10 to leave the corresponding cavity 22 of the housing 20.

Figure 4:
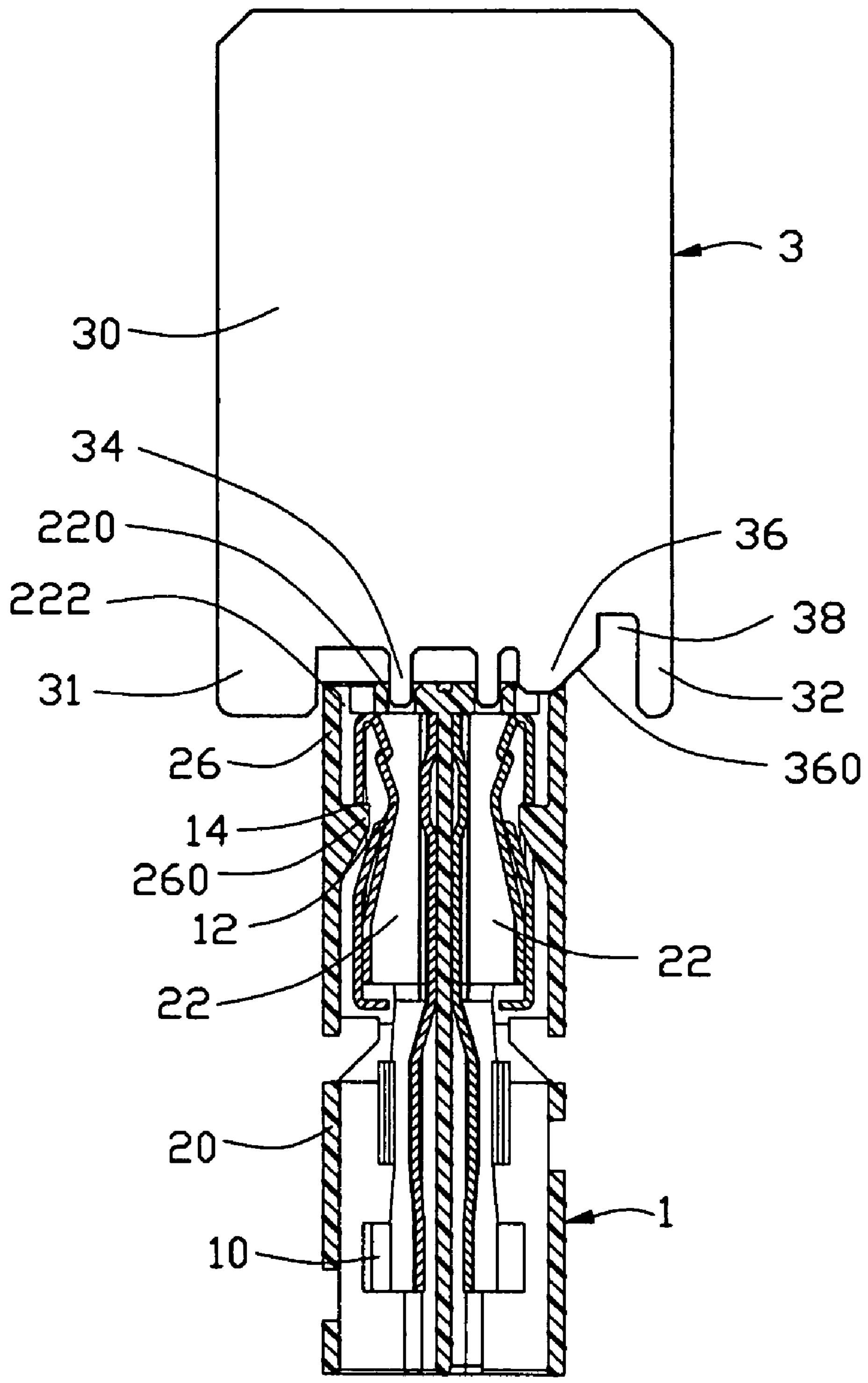
FIG. 4 is a cross-sectional view to illustrate a step of the removal of a contact with the contact extraction tool.
Figure 5:
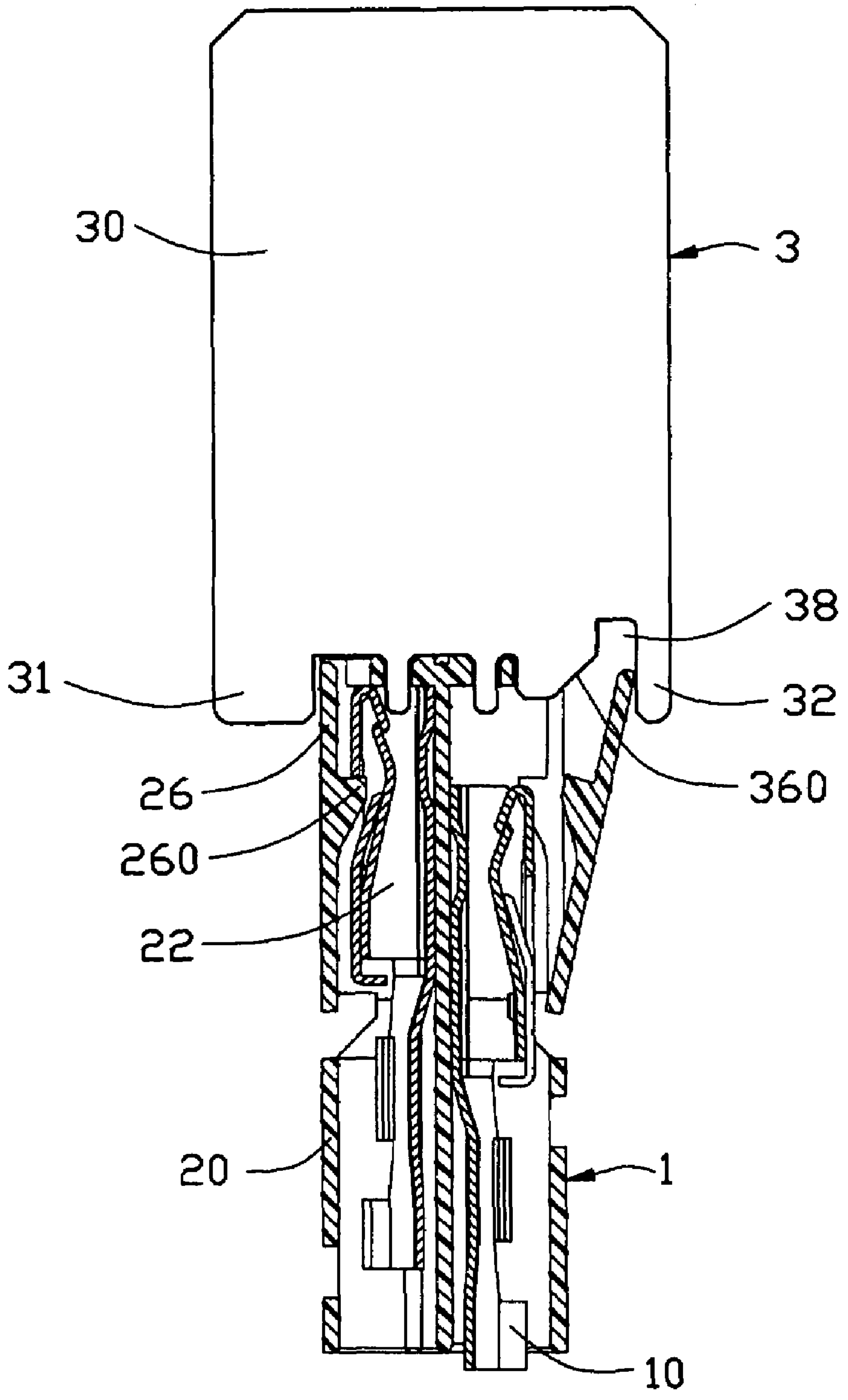
FIG. 5 is a cross-sectional view to illustrate another step of the removal.

With reference to FIGS. 3 through 5, to remove the contact 10 from the connector housing 20, the contact extraction tool 3 is inserted into the housing from the mating face 200 of the housing 20. The registration posts 34 align the contact extraction tool 3 to the housing 20 before the lifting tab 36 contacts the flexible latch 26. One of the registration posts 34 is inserted into a corresponding cavity entrance 220 from which the terminal is to be removed and the other is in the adjacent cavity entrance 220. Upon insertion, the contact extraction tool 3 is aligned to the housing 20 by the registration posts 34. During this insertion, the driving slope 360 of the lifting tab 36 is inserted to the opening 222 and begins to contact the flexible latch 26. Following further insertion of the contact extraction tool 3, the flexible latch 26 of the housing 20 is deflected outwardly by the contact extraction tool 3 via the driving slope 360 of the lifting tab 36 until the contact extraction tool 3 comes to rest on the housing 20 with the low end edge 300 of the contact extraction tool contacting the mating face 200 of the housing 20, thereby deflecting the latch a appropriate distance to remove the contact without overstressing the latch. Furthermore, the flexible latch 26 comes to rest within the cutout 38 of the contact extraction tool 3 and is blocked by the second side support 32, if any improper outward force applied to the flexible latch 26 other than the driving slope 360, to provide the latch 26 further overstress protection and stability. At this time, the flexible latch 26 is fully deflected to cause the lug 260 to disengage with the latching window 14. Now the contact 10 can be removed from the cavity 22 of the housing 20 by manually and gently pulling on a wire (not shown) attached to the contact.

Figure 6:
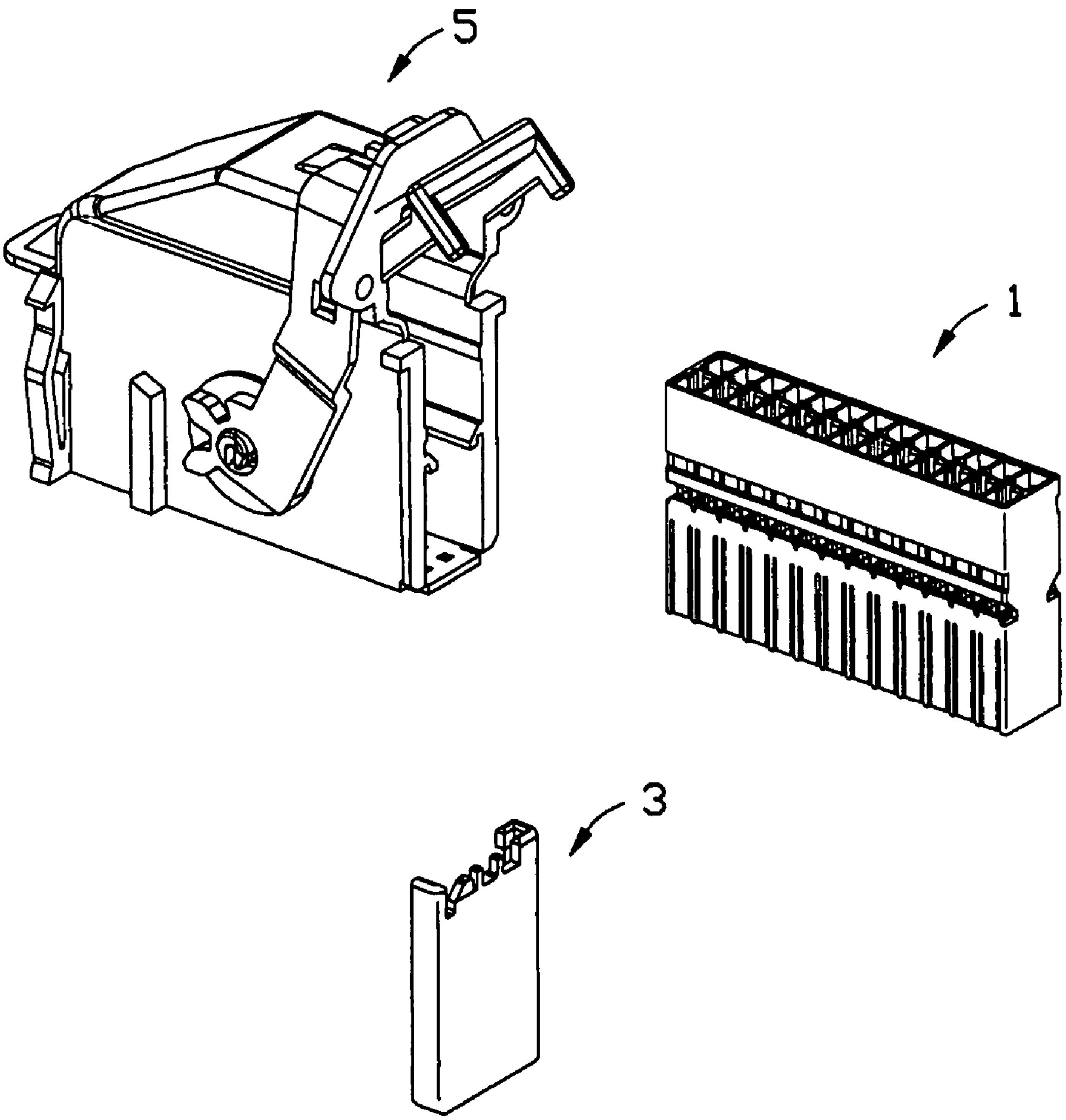
FIG. 6 is a perspective view of the connector assembly.
Figure 7:
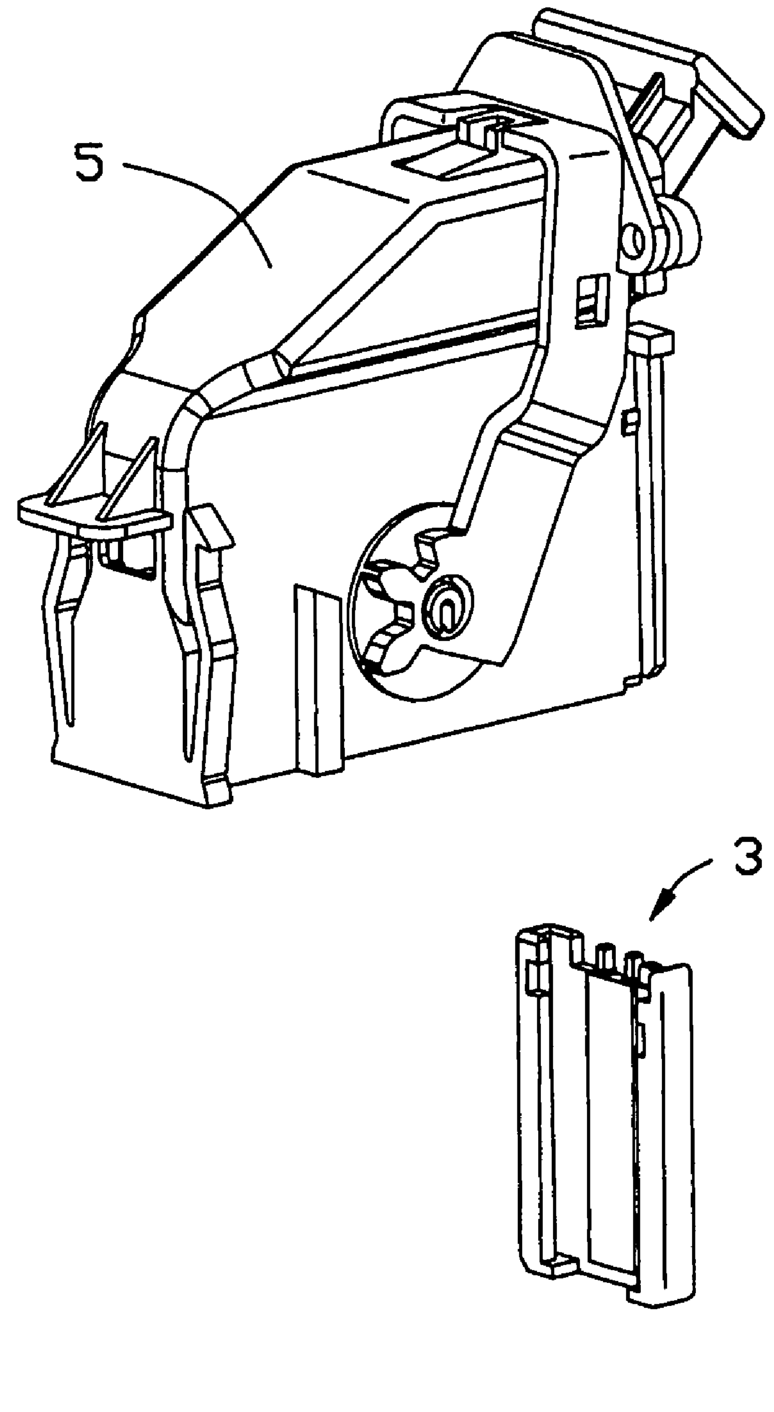
FIG. 7 is anther perspective view of the connector assembly.

FIGS. 6 and 7 show the harness connector 1 is enclosed in the wire housing 5 and the tool 3 is essentially the rear cover of the wire housing 5. That is, the tool 3 is associated with the harness connector 1 in use.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

What is claimed is:

1. A contact extraction tool for use with a wire harness connector, said connector including an insulative housing with a plurality of passageways therein, respectively; a plurality of contacts disposed in the corresponding passageways, respectively, for connecting to wires; the housing defining a side face forming a plurality of flexible latches thereof to latch the corresponding contacts in the corresponding passageways, respectively; a mating face of said housing being communicatively exposed to an exterior for mating consideration, said contact extraction tool being configured to be coupled to the mating face and including:

an actuating device for engageably urging the flexible latch to move for releasing the corresponding contact during repairing; and a registration post for insertion into the corresponding passageway from the mating face; wherein the actuating device includes a lifting tab having not only a tapered structure for deflecting the flexible latch of the housing of the connector but also a confrontation head for pushing the contact to leave the corresponding passageway.

* * * * *